United States Patent
Adachi et al.

(10) Patent No.: US 9,396,132 B2
(45) Date of Patent: Jul. 19, 2016

(54) STORAGE CONTROL DEVICE AND SYSTEM TO IMPROVE DATA RETENTION IN VARIABLE RESISTANCE MEMORY CELLS

(71) Applicant: Sony Corporation, Tokyo (JP)

(72) Inventors: Naohiro Adachi, Tokyo (JP); Keiichi Tsutsui, Kanagawa (JP); Kenichi Nakanishi, Tokyo (JP); Hideaki Okubo, Saitama (JP); Makiko Yamamoto, Tokyo (JP); Yasushi Fujinami, Tokyo (JP)

(73) Assignee: SONY CORPORATION, Tokyo (JP)

( * ) Notice: Subject to any disclaimer, the term of this patent is extended or adjusted under 35 U.S.C. 154(b) by 157 days.

(21) Appl. No.: 14/364,646

(22) PCT Filed: Dec. 20, 2012

(86) PCT No.: PCT/JP2012/083091
§ 371 (c)(1),
(2) Date: Jun. 11, 2014

(87) PCT Pub. No.: WO2013/105414
PCT Pub. Date: Jul. 18, 2013

(65) Prior Publication Data
US 2015/0234749 A1 Aug. 20, 2015

(30) Foreign Application Priority Data
Jan. 12, 2012 (JP) .................. 2012-004433

(51) Int. Cl.
*G06F 12/12* (2006.01)
*G11C 13/00* (2006.01)

(52) U.S. Cl.
CPC .......... *G06F 12/121* (2013.01); *G11C 13/0002* (2013.01); *G06F 2212/69* (2013.01); *G11C 13/0004* (2013.01); *G11C 13/0069* (2013.01)

(58) Field of Classification Search
CPC .............. G06F 12/121; G06F 12/0246; G11C 13/0002; G11C 13/0004; G11C 13/0069
USPC ........................... 711/155; 365/148; 714/719
See application file for complete search history.

(56) References Cited

U.S. PATENT DOCUMENTS

| | | | | |
|---|---|---|---|---|
| 6,158,000 | A * | 12/2000 | Collins | ............................. 713/1 |
| 2010/0235714 | A1* | 9/2010 | Toda | ............................. 714/763 |
| 2011/0235403 | A1* | 9/2011 | Kang | ............................. 365/148 |

(Continued)

FOREIGN PATENT DOCUMENTS

| | | | |
|---|---|---|---|
| JP | 2004-355676 A | 12/2004 | |
| JP | 2007-525785 A | 9/2007 | |

(Continued)

*Primary Examiner* — Than Nguyen
(74) *Attorney, Agent, or Firm* — Chip Law Group

(57) ABSTRACT

Provided is a storage control device including a first read processing unit configured to read data having any one value of a first value or a second value based on a first threshold value in a memory cell, the data being read as first read data, a first write processing unit configured to rewrite the memory cell to the first value when write data is the first value and the first read data is the second value, a second read processing unit configured to read second read data based on a second threshold value different from the first threshold value in the memory cell, and a second write processing unit configured to rewrite the memory cell to the second value when the write data is the second value and the second read data is the first value.

12 Claims, 12 Drawing Sheets

(56) References Cited

U.S. PATENT DOCUMENTS

2012/0069633 A1* 3/2012 Katoh ............................ 365/148
2012/0079331 A1* 3/2012 Toda ............................. 714/719

FOREIGN PATENT DOCUMENTS

WO  WO-2009/016824 A1  2/2009
WO  WO-2010/061760 A1  6/2010

* cited by examiner

FIG. 5
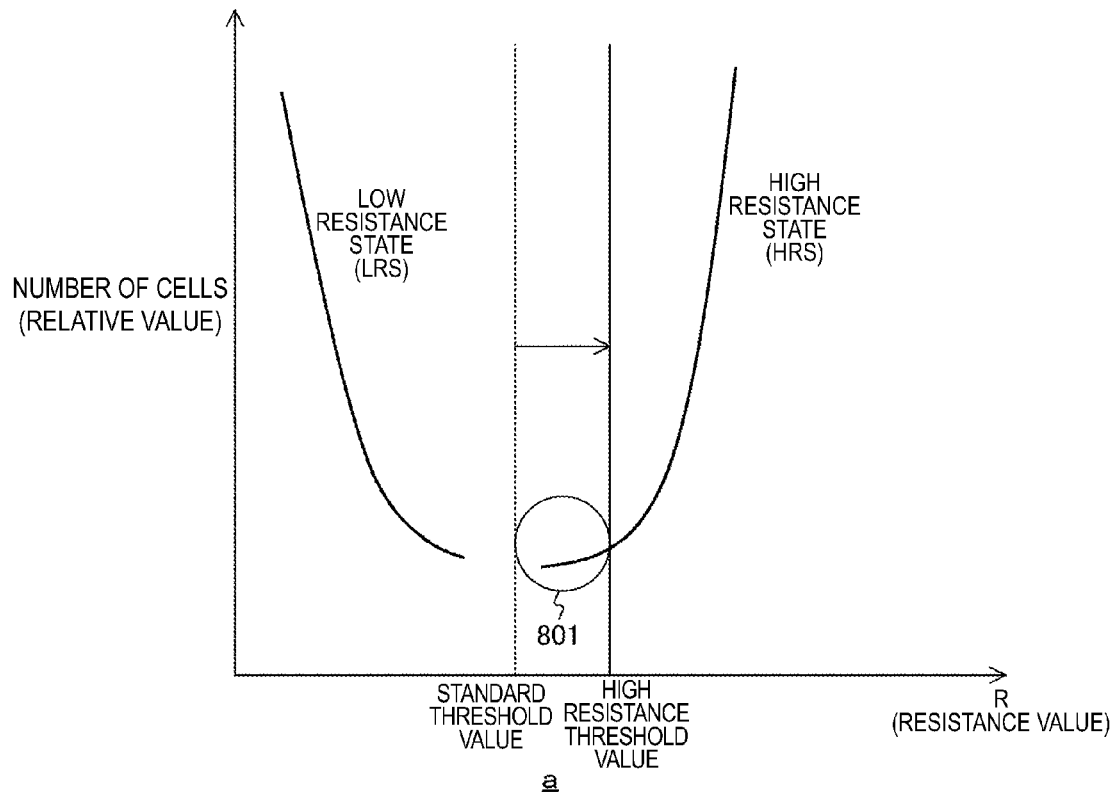
a
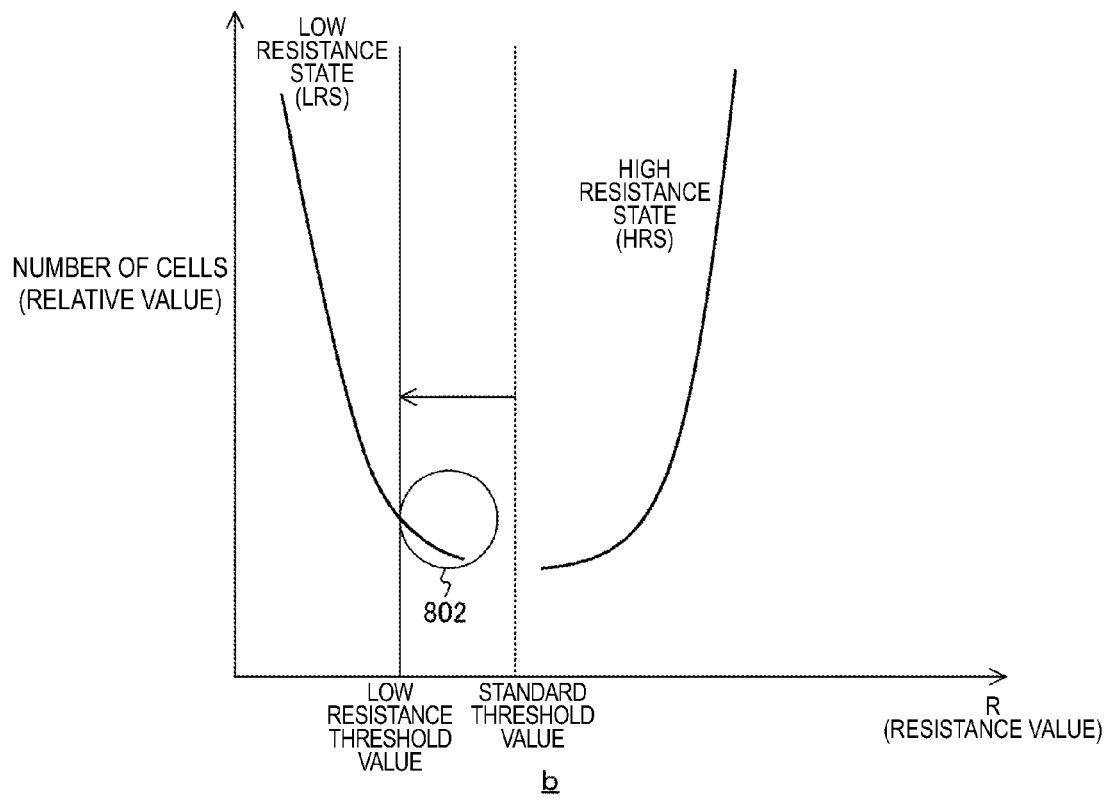
b

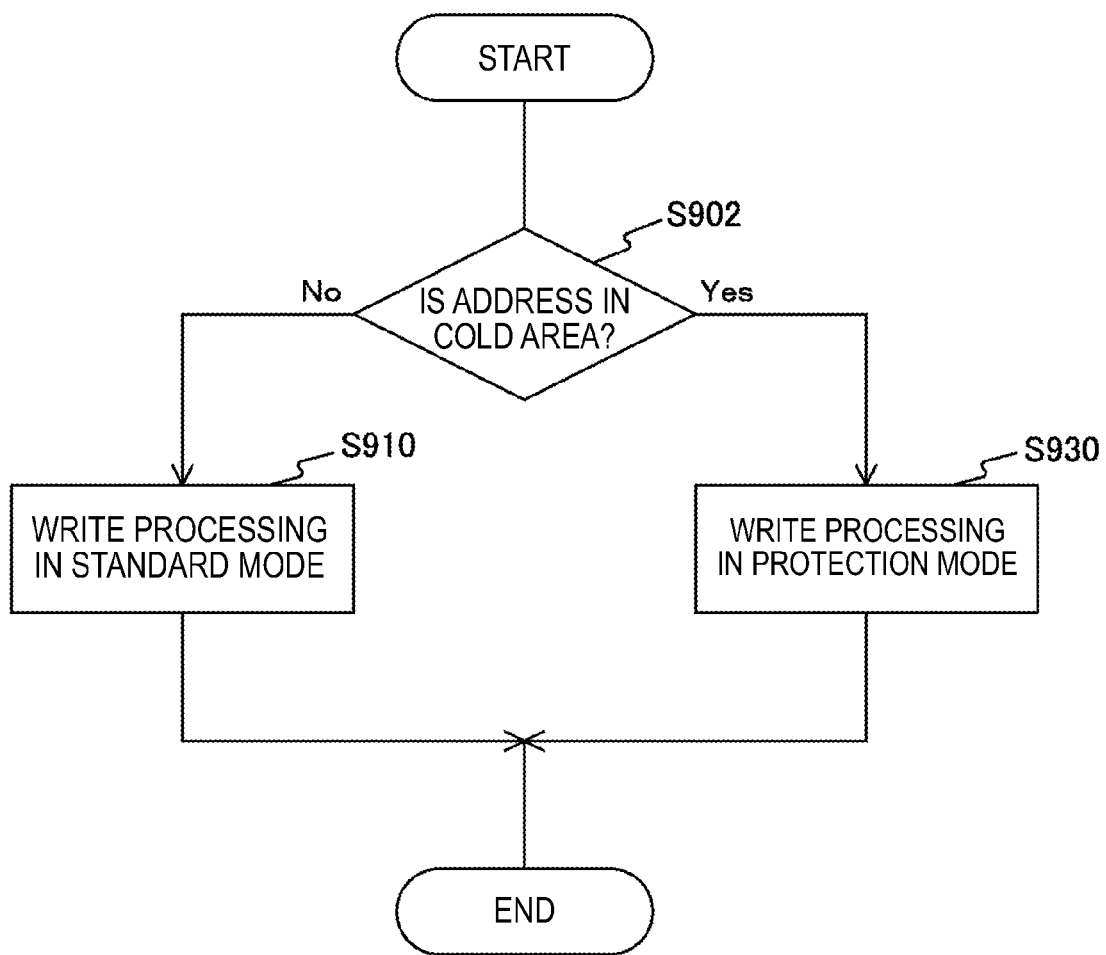

STORAGE CONTROL DEVICE AND SYSTEM TO IMPROVE DATA RETENTION IN VARIABLE RESISTANCE MEMORY CELLS

TECHNICAL FIELD

The present technology relates to a storage control device. Particularly, this technology relates to a storage control device, a storage device, an information processing system, and a processing method thereof for non-volatile memories, and a program that instructs a computer to execute the method.

BACKGROUND ART

In an information processing system, a DRAM (Dynamic Random Access Memory), or the like is used as a work memory. Such a DRAM is generally a volatile memory, and thus, content stored in the memory is lost when power supply is interrupted. On the other hand, non-volatile memories (NVM: Non-Volatile Memories) have been used in recent years. Such non-volatile memories are broadly divided into flash memories for data access in a large data amount and non-volatile random access memory (NVRAM: Non-Volatile RAM) that can randomly access data in a small data amount at a high speed. Here, as a typical example of flash memories, a NAND-type flash memory can be exemplified. On the other hand, as examples of non-volatile random access memories, a ReRAM (Resistance RAM), a PCRAM (Phase-Change RAM), a MRAM (Magnetoresistive RAM), and the like can be exemplified.

The ReRAM is non-volatile memory that uses a variable resistance element, and it is possible to perform the direct rewriting only on a necessary page without the need to perform erasing in units of blocks prior to writing of data. In this regard, it is different from NAND flash memory and other memory that stores a threshold value of the electrification storage amount of a floating gate as data. In a variable resistance element, information of one bit in two states which are a high resistive state (HRS: High Resistive State) and a low resistive state (LRS: Low Resistive State) can be recorded. When a voltage of the same polarity is continuously applied to such a variable resistance element many times, there is a problem of disturbance in the resistivity distribution that resistance value of the variable resistance treatment is changed. For example, as the same polarity is continuously applied with increasing number of times, HRS will be changed to LRS, and LRS will be changed to HRS. If the resistance value is changed in this way, when the voltage of opposite polarity is applied in the next time, there is a risk that recording is not performed appropriately at the same voltage as the normal state or a voltage with a large absolute value is necessary to perform appropriate recording. Thus, in related art, there has been proposed a writing method of rewriting and erasing only a necessary bit in a selective manner by reading out data written previously at the time of write process and comparing it with write data (for example, refer to Patent Literature 1).

CITATION LIST

Patent Literature

Patent Literature 1: JP 2007-525785T

SUMMARY OF INVENTION

Technical Problem

In the related art described above, when the data written previously and the write data are the same data, a write pulse is not generated, and thus identical data is not to be written continuously. However, when such a control is performed, a state in which the physical writing to the memory cell does not occur is continued if there is only identical data continuously, and there will be a problem that data retention characteristics (retention) are deteriorated with the elapse of time.

The present technology is made in view of such circumstances, and an object thereof is to improve data retention characteristics of a non-volatile memory.

Solution to Problem

The present technology has been made in order to solve the above-mentioned issues. According to the first aspect of the present technology, there is provided a storage control device including a first read processing unit configured to read data having any one value of a first value or a second value based on a first threshold value in a memory cell, the data being read as first read data, a first write processing unit configured to rewrite the memory cell to the first value when write data is the first value and the first read data is the second value, a second read processing unit configured to read second read data based on a second threshold value different from the first threshold value in the memory cell, and a second write processing unit configured to rewrite the memory cell to the second value when the write data is the second value and the second read data is the first value. Accordingly, in the storage control device, there is an effect that the enhancement of data retention characteristics is achieved by controlling a bitwise operation for a write process based on pre-read data using a first threshold value or a second threshold value different from a standard threshold value. In addition, the first write processing unit can be configured not to perform rewriting in a case except when the write data is the first value and the first read data is the second value. Additionally, the second write processing unit can be configured not to perform rewriting in a case except when the write data is the second value and the second read data is the first value.

According to the first aspect of the present technology, the first threshold value may be set to a higher resistance state side than a standard threshold value, and the second threshold value may be set to a lower resistance state side than the standard threshold value. Here, the first value may be a logical value 0, and the second value may be a logical value 1.

According to the first aspect of the present technology, the memory cell may be a variable resistance element, the first threshold value may be set to a lower resistance state side than a standard threshold value, and the second threshold value may be set to a higher resistance state side than the standard threshold value. Here, the first value may be a logical value 1, and the second value may be a logical value 0.

According to the second aspect of the present technology, there is provided a storage control device including an operation mode setting unit configured to set any one of a first mode or a second mode as an operation mode, a first read processing unit configured to read data having any one value of a first value or a second value based on a first threshold value in a memory cell in a case where the first mode is set, the data being read as first read data, a first write processing unit configured to rewrite the memory cell to the first value when write data is the first value and the first read data is the second value in a case where the first mode is set, a second read processing unit configured to read second read data based on a second threshold value different from the first threshold value in the memory cell in a case where the first mode is set, a second write processing unit configured to rewrite the memory cell to the second value when the write data is the second value and the second read data is the first value in a case where the first mode is set, a third read processing unit configured to read a third read data based on a standard threshold value in the memory cell in a case where the second mode is set, and a third write processing unit configured to rewrite the memory cell to the first value when the write data is the first value and the third read data is the second value and configured to rewrite the memory cell to the second value when the write data is the second value and the third read data is the first value, in a case where the second mode is set. Accordingly, there is an effect that the balance between the enhancement of data retention characteristics and the number of pre-reading times is achieved by switching between a first mode in which the pre-reading using a first or second threshold value is performed and a second mode in which the pre-reading using a standard threshold value is performed. In addition, the first write processing unit can be configured not to perform rewriting in a case except when the write data is the first value and the first read data is the second value. Additionally, the second write processing unit can be configured not to perform rewriting in a case except when the write data is the second value and the second read data is the first value. Moreover, the third write processing unit can be configured not to perform rewriting in a case except when the write data is the first value and the third read data is the second value or when the write data is the second value and the third read data is the first value.

According to the second aspect of the present technology, if an error is detected and an error correction is performed on the detected error upon read processing, the first mode may be set as the operation mode, an address for the error correction may be set as the write address, and the error-corrected data may be rewritten as the write data. Accordingly, there is an effect that the data refresh is performed by the first mode.

According to the third aspect of the present technology, there is provided a storage device including a memory array configured to include a memory cell, a first read processing unit configured to read data having any one value of a first value or a second value based on a first threshold value in the memory cell, the data being read as first read data, a first write processing unit configured to rewrite the memory cell to the first value when write data is the first value and the first read data is the second value, a second read processing unit configured to read second read data based on a second threshold value different from the first threshold value in the memory cell, and a second write processing unit configured to rewrite the memory cell to the second value when the write data is the second value and the second read data is the first value. Accordingly, in the storage device, there is an effect that the enhancement of data retention characteristics is achieved by controlling a bitwise operation for a write process based on pre-read data using the first threshold value or the second threshold value different from a standard threshold value of a memory cell. In addition, the first write processing unit can be configured not to perform rewriting in a case except when the write data is the first value and the first read data is the second value. Additionally, the second write processing unit can be configured not to perform rewriting in a case except when the write data is the second value and the second read data is the first value.

According to the fourth aspect of the present technology, there is provided a storage device including a memory array configured to include a memory cell, an operation mode setting unit configured to set any one of a first mode or a second mode as an operation mode, a first read processing unit configured to read data having any one value of a first value or a second value based on a first threshold value in the memory cell in a case where the first mode is set, the data being read as first read data, a first write processing unit configured to rewrite the memory cell to the first value when write data is the first value and the first read data is the second value in a case where the first mode is set, a second read processing unit configured to read second read data based on a second threshold value different from the first threshold value in the memory cell in a case where the first mode is set, a second write processing unit configured to rewrite the memory cell to the second value when the write data is the second value and the second read data is the first value in a case where the first mode is set, a third read processing unit configured to read a third read data based on a standard threshold value in the memory cell in a case where the second mode is set, and a third write processing unit configured to rewrite the memory cell to the first value when the write data is the first value and the third read data is the second value and configured to rewrite the memory cell to the second value when the write data is the second value and the third read data is the first value, in a case where the second mode is set. Accordingly, in the storage device, there is an effect that the balance between the enhancement of data retention characteristics and the number of pre-reading times is achieved by switching between a first mode in which the pre-reading using a first or second threshold value is performed and a second mode in which the pre-reading using a standard threshold value is performed. In addition, the first write processing unit can be configured not to perform rewriting in a case except when the write data is the first value and the first read data is the second value. Additionally, the second write processing unit can be configured not to perform rewriting in a case except when the write data is the second value and the second read data is the first value. Moreover, the third write processing unit can be configured not to perform rewriting in a case except when the write data is the first value and the third read data is the second value or when the write data is the second value and the third read data is the first value.

According to the fifth aspect of the present technology, there is provided an information processing system including a memory array configured to include a memory cell, an operation mode setting unit configured to set any one of a first mode or a second mode as an operation mode, a first read processing unit configured to read data having any one value of a first value or a second value based on a first threshold value in the memory cell in a case where the first mode is set, the data being read as first read data, a first write processing unit configured to rewrite the memory cell to the first value when write data is the first value and the first read data is the second value in a case where the first mode is set, a second read processing unit configured to read second read data based on a second threshold value different from the first threshold value in the memory cell in a case where the first mode is set, a second write processing unit configured to rewrite the memory cell to the second value when the write data is the second value and the second read data is the first value in a case where the first mode is set, a third read processing unit configured to read a third read data based on a standard threshold value in the memory cell in a case where the second mode is set, a third write processing unit configured to rewrite the memory cell to the first value when the write data is the first value and the third read data is the second value and configured to rewrite the memory cell to the second value when the write data is the second value and the third read data is the first value, in a case where the second mode is set, and a host computer configured to issue a read command or a write command to the memory array. Accordingly, in the information processing system, there is an effect that the balance between the enhancement of data retention characteristics and the number of pre-reading times is achieved by switching between a first mode in which the pre-reading using a first or second threshold value is performed and a second mode in which the pre-reading using a standard threshold value is performed. In addition, the first write processing unit can be configured not to perform rewriting in a case except when the write data is the first value and the first read data is the second value. Additionally, the second write processing unit can be configured not to perform rewriting in a case except when the write data is the second value and the second read data is the first value. Moreover, the third write processing unit can be configured not to perform rewriting in a case except when the write data is the first value and the third read data is the second value or when the write data is the second value and the third read data is the first value.

According to the fifth aspect of the present technology, the host computer may add information about a rewriting frequency of write data according to the write command to the write command and issues the command, and the operation mode setting unit may set the first mode if the rewriting frequency of the write data indicates a low frequency, and sets the second mode if otherwise. Accordingly, there is an effect that the operation mode is set according to an instruction from the host computer.

According to the sixth aspect of the present technology, there is provided a storage controlling method including performing a first read process of reading data having any one value of a first value or a second value based on a first threshold value in a memory cell, the data being read as first read data, performing a first write process of rewriting the memory cell to the first value when write data is the first value and the first read data is the second value, performing a second read process of reading second read data based on a second threshold value different from the first threshold value in the memory cell, and performing a second write process of rewriting the memory cell to the second value when the write data is the second value and the second read data is the first value. Accordingly, in the storage control device, there is an effect the enhancement of data retention characteristics is achieved by controlling a bitwise operation for a write process based on pre-read data using a first threshold value or a second threshold value different from a standard threshold value. In addition, the first write processing unit can be configured not to perform rewriting in a case except when the write data is the first value and the first read data is the second value. Additionally, the second write processing unit can be configured not to perform rewriting in a case except when the write data is the second value and the second read data is the first value.

Advantageous Effects of Invention

According to the present technology, there is an excellent effect of allowing data retention characteristics of non-volatile memory to be improved.

BRIEF DESCRIPTION OF DRAWINGS

FIG. 5 is a diagram for explaining a low resistance threshold value and a high resistance threshold value according to an embodiment of the present technology.

FIG. 12 is a flow diagram illustrating an exemplary processing procedure of an information processing system according to a fourth embodiment of the present technology.

DESCRIPTION OF EMBODIMENTS

In the following, modes for implementing the present technology (hereinafter, referred to as embodiment) will be described. The description will be given in the following order.

1. First Embodiment (example of performing pre-reading twice by shifting readout threshold prior to writing)
2. Second Embodiment (an example having two modes having different number of pre-reading times)
3. Third Embodiment (example of performing refreshing upon occurrence of error correction)
4. Fourth Embodiment (example of performing mode switching in accordance with data attribute)

1. First Embodiment

Configuration of Information Processing System

Figure 1:
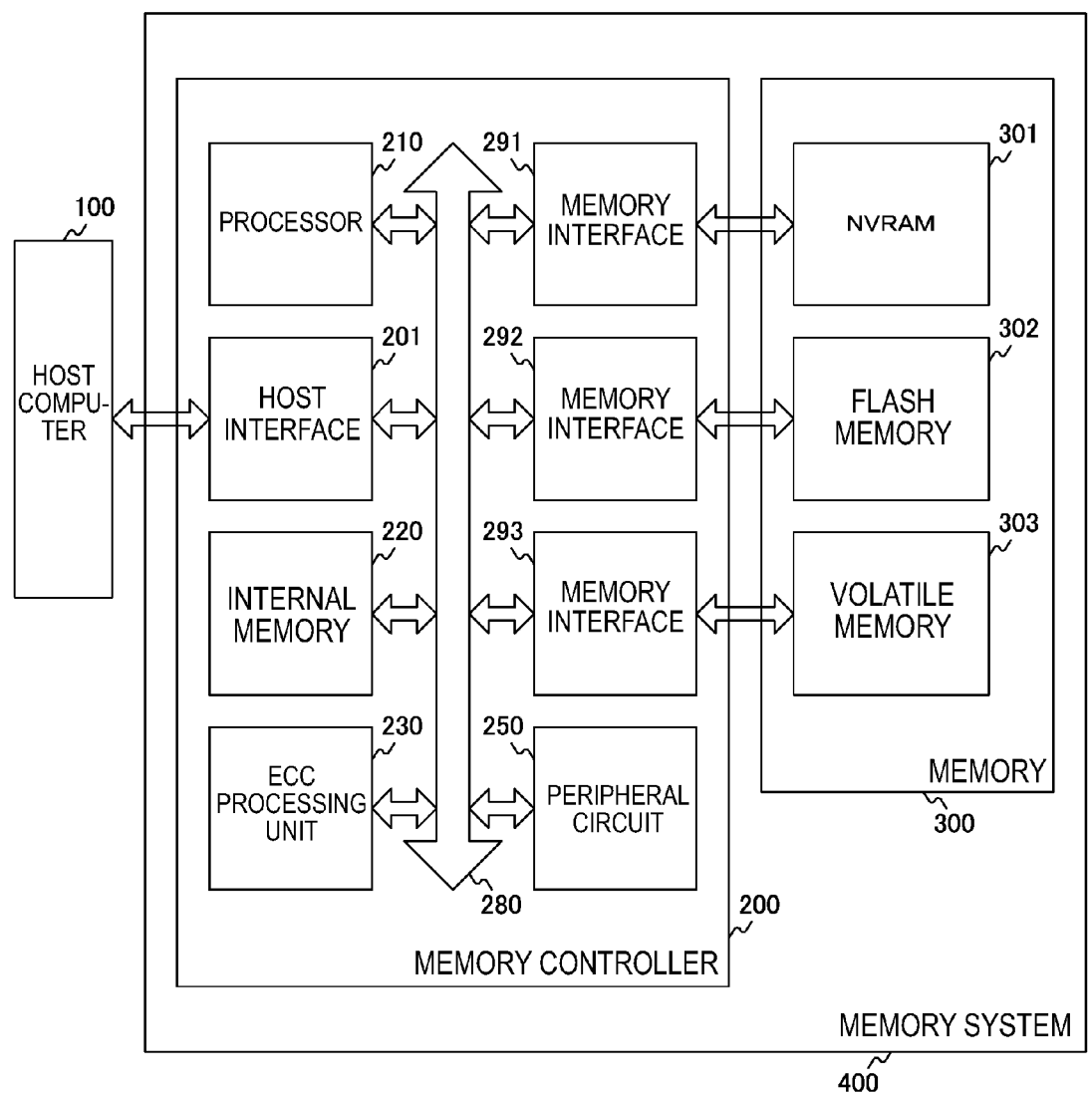
FIG. 1 is a diagram illustrating an exemplary configuration of an information processing system according to an embodiment of the present technology.

FIG. 1 is a diagram illustrating an exemplary configuration of an information processing system according to an embodiment of the present technology. The information processing system includes a host computer 100, a memory 300, and a memory controller 200. The memory controller 200 and the memory 300 constitute a memory system 400. The host computer 100 issues a command to request a data read or write from or in the memory system 400.

The memory 300 includes non-volatile memory in addition to a typical volatile memory 303. The non-volatile memory is classified roughly into a flash memory 302 that allows data access to be performed for large amount of data and a non-volatile random access memory (NVRAM) 301 that allows random access to be performed for small amount of data at a high speed. Here, as a typical example of the flash memory 302, NAND-type flash memory can be exemplified. On the other hand, as an example of the NVRAM 301, ReRAM, PCRAM, MRAM or the like can be exemplified, but it is assumed that in this embodiment the ReRAM especially using a variable resistance element is used. The volatile memory 303 is used as a working area, and is also used to store data for management. Furthermore, the volatile memory 303 can also be used as a cache. The volatile memory 303 can be implemented by DRAM, SRAM, and other memory. Data that is stored in the volatile memory 303 is held in the NVRAM 301 or the flash memory 302 as necessary in preparation for power cut-off, so that it may be re-used when the power is turned on later.

The memory controller 200 includes a processor 210, an internal memory 220, an ECC processing unit 230, a peripheral circuit 250, a host interface 201, and memory interfaces 291 to 293. They are connected to each other via a bus 280.

The processor 210 is a processing device that interprets and executes a control command from the host computer 100. This processor 210 executes a program by regarding a storage area in the internal memory 220 as a program storage area and work area thereof.

The internal memory 220 is a memory that includes internal ROM and RAM which are not shown. A program may be stored in the internal ROM or may be transferred to the internal RAM from the memory 300 at startup. The internal RAM is used in various applications, for example, as a work area or an area for temporarily storing data for management or the like.

The ECC processing unit 230 generates an error correcting code (ECC: Error Correcting Code) which is added to each of data in association with each other and performs error correction using the ECC. The ECC processing unit 230 may be implemented in hardware or may be implemented in software by allowing the processor 210 to execute a program.

The peripheral circuit 250 is a peripheral circuit of the processor 210, and includes, for example, a built-in timer, general-purpose input/output (GPIO: General Purpose Input/Output), or the like.

The host interface 201 is an interface for performing interaction with the host computer 100. The memory system 400 operates as a memory system which is connected through the host interface, receives a control command for controlling the memory 300 from the host computer 100, and is controlled by the control command. As the host interface 201, for example, SATA, PCI Express, eMMC, USB or the like can be used.

The memory interface 291 is an interface that performs interaction with the NVRAM 301. The memory interface 292 is an interface that performs interaction with the flash memory 302. The memory interface 293 is an interface that performs interaction with the volatile memory 303.

The memory system 400 writes data in the memory 300 by a write command and reads data from the memory 300 by a read command. The write and read commands allows a head logical address where a target data exists and data size to be specified as a parameter. When the memory system 400 receives data of a write command, ECC is added to the data to be written to the non-volatile memory (NVRAM 301 or flash memory 302).

Figure 2:
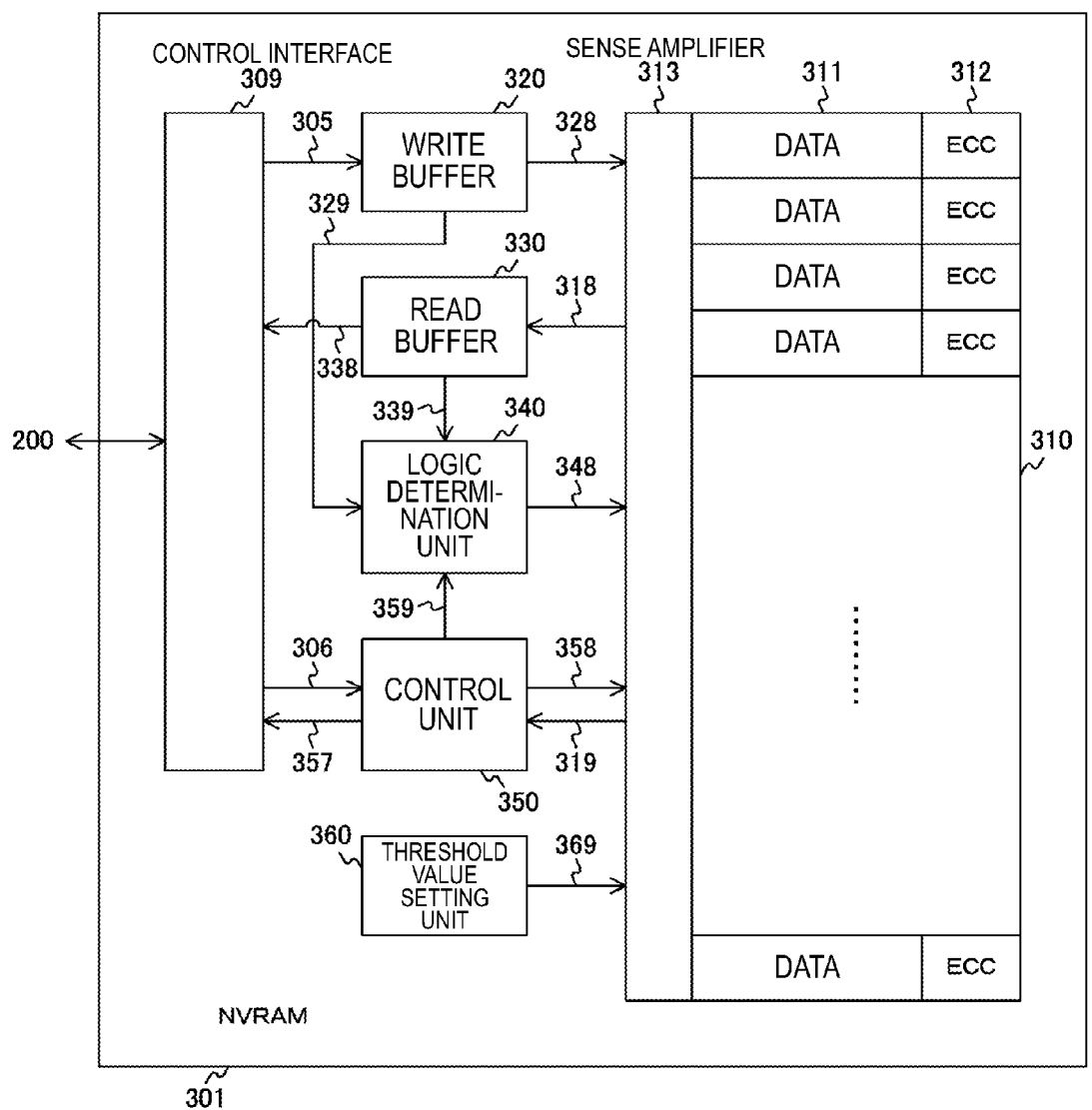
FIG. 2 is a diagram illustrating an exemplary configuration of a non-volatile random access memory 301 according to an embodiment of the present technology.

FIG. 2 is a diagram illustrating an exemplary configuration of the non-volatile random access memory (NVRAM) 301 according to an embodiment of the present technology. The NVRAM 301 includes a memory array 310, a sense amplifier 313, a write buffer 320, a read buffer 330, a logic determination unit 340, a control unit 350, a threshold value setting unit 360, and a control interface 309.

The control interface 309 is an interface that takes charge of the connection with the memory controller 200. The control interface 309 is connected with the write buffer 320, the read buffer 330, the logic determination unit 340, and the control unit 350.

The memory array 310 is an array in which memory cells, which retain a predetermined state for each bit, are arranged in a lattice pattern. The memory cell of the memory array 310 is resistive random access memory composed of a variable resistance element. The memory array 310 is composed of a plurality of pages. The page is provided therein with a redundant part 312 used to store error correcting code (ECC) or the like, in addition to a data part 311 used to store data. In the memory array 310, the readout or write-in is performed by way of the sense amplifier 313.

The sense amplifier 313 is an amplifier circuit used to amplify a voltage from the memory array 310. The sense amplifier 313 is connected with the write buffer 320, the read buffer 330, the logic determination unit 340, the control unit 350, and the threshold value setting unit 360.

The write buffer 320 is a buffer for temporarily holding data to be written to the memory array 310. The write buffer 320 is held the write data from the control interface 309 via a signal line 305 and outputs it to the sense amplifier 313 via a signal line 328.

The read buffer 330 is a buffer for temporarily holding data read from the memory array 310. The read buffer 330 holds pre-read data prior to writing at the time of writing. The read buffer 330 holds the read data from the sense amplifier 313 via a signal line 318 and outputs it to the control interface 309 via a signal line 338.

The logic determination unit 340 performs logic determination based on data held in the write buffer 320 and the read buffer 330 to generate mask data. The mask data generated by the logic determination unit 340 is supplied to the memory array 310 via a signal line 348.

The control unit 350 is a controller for controlling each block in the NVRAM 301. The control unit 350 is implemented, for example, by a sequencer. The control unit 350 receives a read or write instruction or the like from the control interface 309 via a signal line 306 and transmits a response to the control interface 309 via a signal line 357. In addition, the control unit 350 transmits a control signal to the sense amplifier 313 via a signal line 358 and receives a response from the sense amplifier 313 via a signal line 319. Additionally, the control unit 350 transmits a control signal to the logic determination unit 340 via a signal line 359.

The threshold value setting unit 360 is configured to set a threshold value at the time of reading from the memory array 310. Details of a threshold value which is set by the threshold value setting unit 360 will be described later. The threshold value setting unit 360 may be a reference voltage source or reference current source which is compared with a readout voltage in the sense amplifier 313, and can be implemented by, for example, having a plurality of resistors and switching between them. The output from the threshold value setting unit 360 is transmitted to the sense amplifier 313 via a signal line 369. In addition, when a threshold value is switched, an instruction from the control unit 350 is transmitted to the sense amplifier 313 via the signal line 358.

Figure 3:
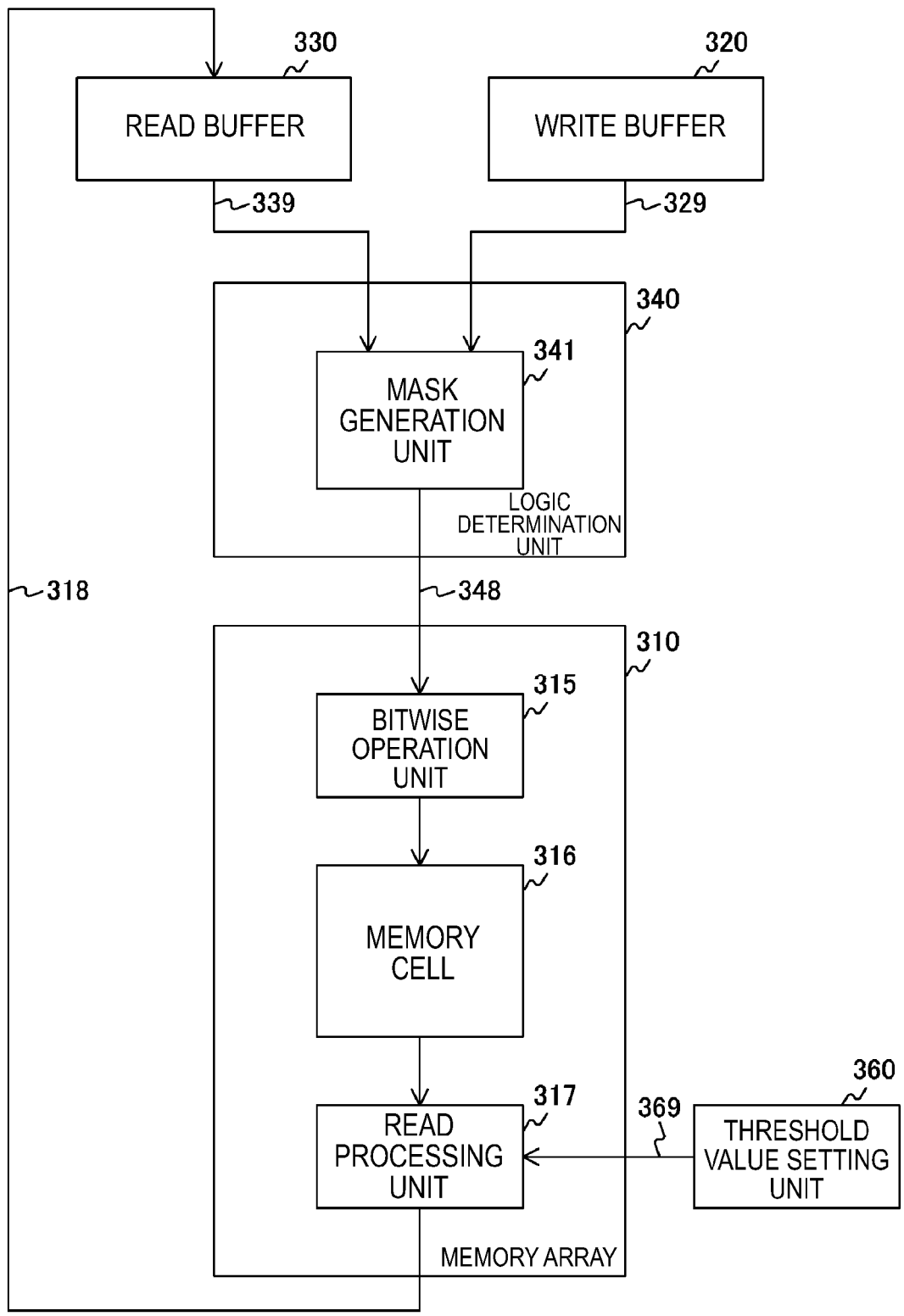
FIG. 3 is a diagram illustrating an exemplary functional configuration according to an embodiment of the present technology.

FIG. 3 is a diagram illustrating an exemplary functional configuration according to an embodiment of the present technology. In this example, it is assumed that the logic determination unit 340 has a function of a mask generation unit 341, and the memory array 310 has functions of a bitwise operation unit 315, a memory cell 316, and a read processing unit 317.

The mask generation unit 341 compares the write data held in the write buffer 320 with the pre-read data held in the read buffer 330 for each bit, and generates an erasing mask or programming mask composed of corresponding bits. The erasing mask indicates that H level is erased to L level for a bit in which the pre-read data is H level and the write data is L level, and the other bits are masked. The programming mask indicates that L level is programmed to H level for a bit in which the pre-read data is L level and the write data is H level, and the other bits are masked.

The bitwise operation unit 315 performs erasure or programming for each bit in a data area corresponding to a write address of the memory cell 316 according to the erasing mask or programming mask generated by the mask generation unit 341. In other words, an operation of erasing to L level is performed only for a bit indicating that erasure is performed when the erasing mask is given, and any rewriting is not performed for the other bits. In addition, an operation of programming to H level is performed only for a bit indicating that programming is performed when the programming mask is given, and any rewriting is not performed for the other bits.

The read processing unit 317 reads data from a data area corresponding to a write address of the memory cell 316 based on a threshold value which is set in the threshold value setting unit 360 prior to the write operation. The data, which is read prior to the write operation in this way, is held in the read buffer 330 as pre-read data.

The processing in the exemplary functional configuration is repeated appropriately by the control unit 350 as necessary. As will be described later, in this embodiment, pre-reading is performed in the read processing unit 317 to generate each of the erasing mask and the programming mask. In addition, the erasure and programming is performed in the bitwise operation unit 315. In other words, the read processing unit 317 is an example of a first read processing unit, a second read processing unit, and a third read processing unit described in the claims, and the bitwise operation unit 315 is an example of a first write processing unit, a second write processing unit, and a third write processing unit described in the claims. It should be noted that, although processing is assumed to be repetitively performed by the control unit 350 in this embodiment, each of the first, second, and third read processing units, and each of the first, second, and third write processing units may be implemented as separate components.

[Threshold Value of Pre-Read]

Figure 4:
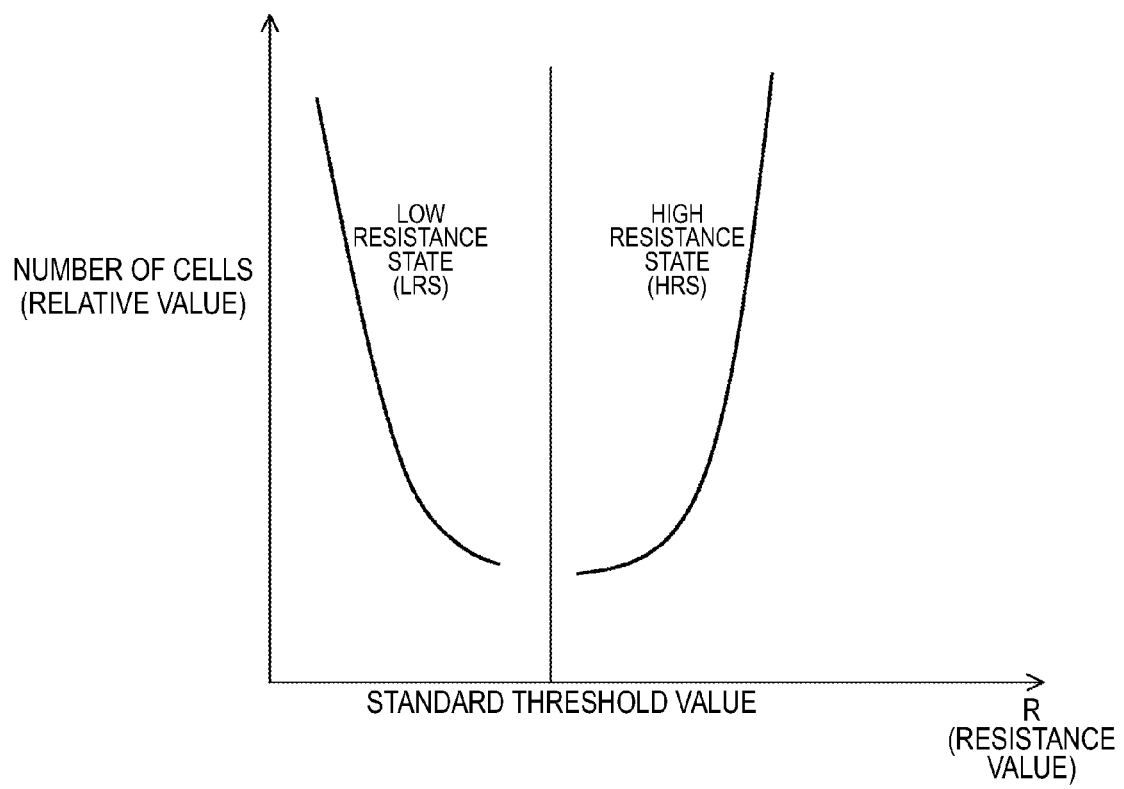
FIG. 4 is a diagram illustrating schematically the resistance distribution of a variable resistance element.

FIG. 4 is a diagram illustrating schematically the resistance distribution of a variable resistance element. The horizontal axis represents a resistance value R, and the vertical axis represents a statistical distribution of the number of cells as a relative value. As shown in this figure, the resistance distribution of a variable resistance element is broadly divided into two distributions, called a low resistance state (LRS: Low-Resistance State) and a high resistance state (HRS: High-Resistance State). A threshold value used commonly to divide these low and high resistance states is referred to as a standard threshold value.

A variable resistance element functions as a memory cell by associating each of the high resistance state and the low resistance state of the variable resistance element with any one of logical value 0 or 1. The way how a resistance state is associated with any one of logical value 0 or 1 is optionally determined. When the high resistance state is associated with the logical value 0 and the low resistance state is associated with the logical value 1, a cell in the low resistance state is erased to be in the high resistance state and a cell in the high resistance state is programmed to be in the low resistance state. When the low resistance state is associated with the logical value 0 and the high resistance state is associated with the logical value 1, a cell in the high resistance state is erased to be in the low resistance state and a cell in the low resistance state is programmed to be in the high resistance state.

FIG. 5 is a diagram for explaining a low resistance threshold value and a high resistance threshold value according to an embodiment of the present technology. In a of the figure, a bit 801 at the bottom that is in a high resistance state has data retention characteristics which are poorer than those of bits in the other parts. Thus, for a memory cell that is in the state of the bit 801 at the bottom, it is desirable to improve the state by writing again. However, in a case where the control in which writing is not allowed to be identical state is performed, if this memory cell is recognized to be in a high resistance state, writing is not allowed to be in a continuous high resistance state. Thus, in this embodiment, the pre-reading is performed by allowing a threshold value as a reference to be shifted to a high resistance state side and using the high resistance threshold value so that the bit 801 at the bottom that is in the high resistance state is regarded as in the low resistance state. Thus, the pre-reading is performed by regarding the bit 801 at the bottom to be in the low resistance state, and then the writing is performed by allowing the bit to become in the high resistance state.

Similarly, in b of the figure, a bit 802 at the bottom that is in a low resistance state has data retention characteristics which are poorer than those of bits in the other parts. Thus, as in the case of the bit 801 at the bottom, the pre-reading is performed by allowing a threshold value as a reference to be shifted to a low resistance state side and using the low resistance threshold value so that the bit 802 at the bottom that is in the low resistance state is regarded as in the high resistance state. Thus, the pre-reading is performed by regarding the bit 802 at the bottom as in the high resistance state, and then the writing is performed by allowing the bit to become in the low resistance state.

[Specific Example of Erasure and Programming]

Figure 6:
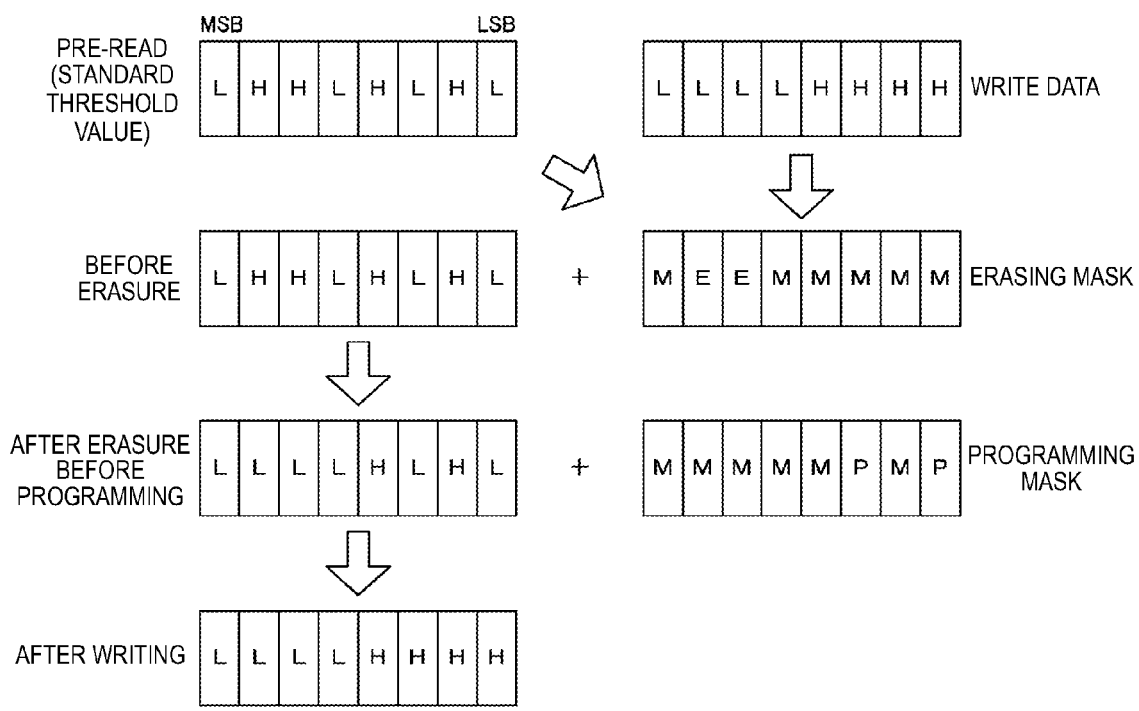
FIG. 6 is a diagram illustrating a specific example of performing writing by erasure and programming on a variable resistance element.

FIG. 6 is a diagram illustrating a specific example of performing writing by performing erasure and programming on a variable resistance element. Here, a general flow using a standard threshold value is illustrated, and it is not intended to selectively use a low resistance threshold value and a high resistance threshold value. In this example, it is assumed that pre-reading is performed previously when write data "LLLL-HHHH" is written, and "LHHLHLHL" is obtained as a current value. Then, in order for writing that becomes in an identical state to be not occurred, a erasing mask is created so that a bit to be erased to "L" has a current value which should be only the bit position of "H", and a programming mask is created so that a bit to be programmed to "H" has a current value which should be only the bit position of "L". In addition, in this example, the "L" level is corresponded to the logical value 0, and the "H" level is corresponded to the logical value 1.

In this case, bits in which the current value "H" is necessary to be erased to "L" are the fifth and sixth bits, and thus a pattern of "MEEMMMMM" is obtained as an erasing mask. Here, "E" indicates a bit that is to be erased, and "M" indicates a bit that is not to be erased.

On the other hand, bits in which the current value "L" is necessary to be programmed to "H" is the zeroth and second bits, and thus a pattern of "MMMMMPMP" is obtained as a programming mask. Here, "P" indicates a bit that is to be programmed, and "M" indicates a bit that is not to be programmed.

When these erasing and programming masks are used, erasure is performed according to the erasing mask and programming is performed according to the programming mask. Note that it does not matter which one of erasure and programming is performed first in their processing order.

Figure 7:
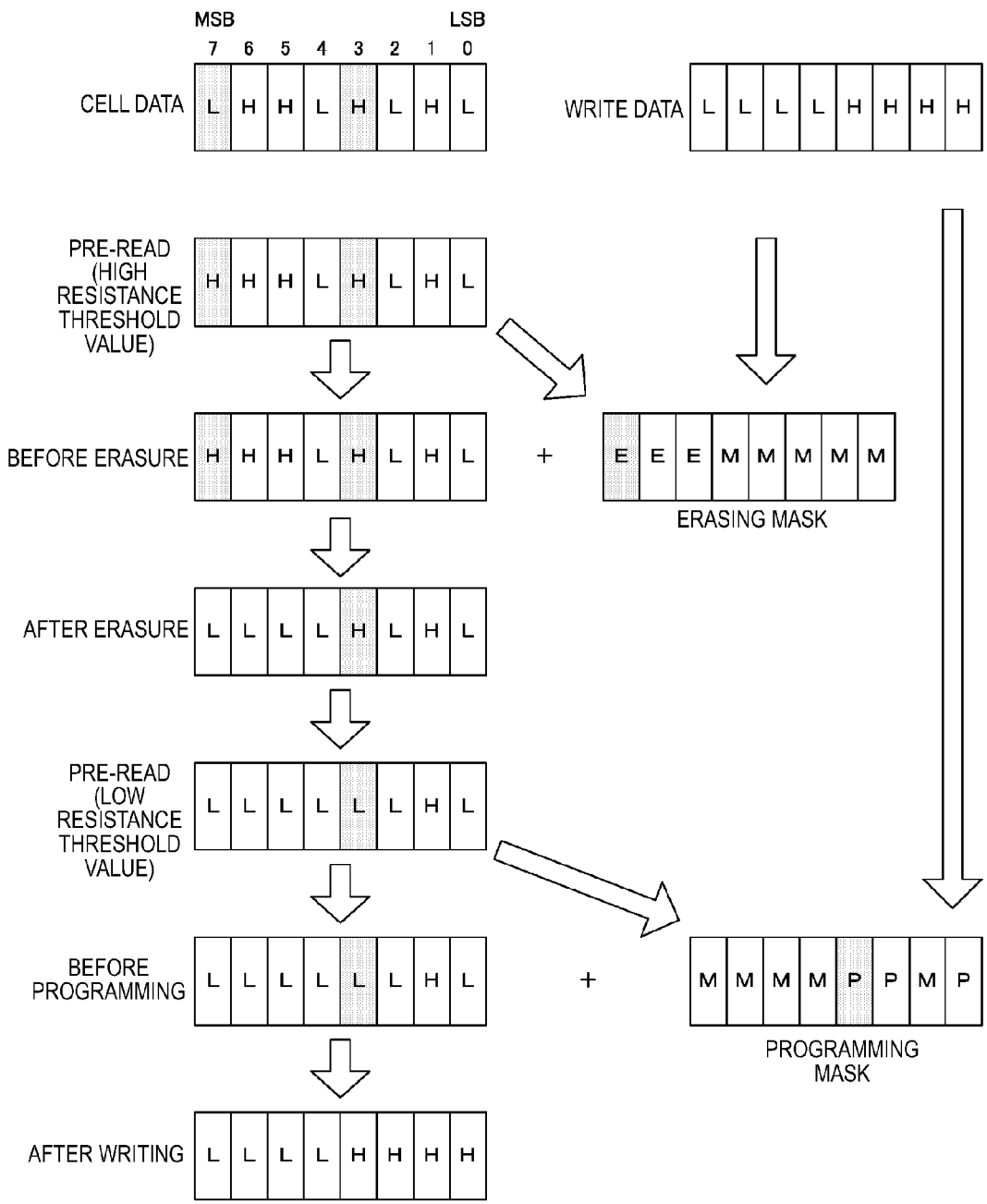
FIG. 7 is a diagram illustrating a specific example of performing writing according to an embodiment of the present technology.

FIG. 7 is a diagram illustrating a specific example of performing writing according to an embodiment of the present technology. Here, pre-reading is performed by selectively using a low resistance threshold value and a high resistance threshold value. In this example as well, it is assumed that pre-reading is performed previously when write data "LLLL-HHHH" is written and "LHHLHLHL" is obtained as a current value. However, as a state of the memory cell, it is assumed that the third bit is the bit 802 at the bottom that is in a low resistance state and the seventh bit is the bit 801 at the bottom that is in a high resistance state.

First, in order to generate an erasing mask, pre-reading is performed using a high resistance threshold value. In this example, the seventh bit is in the bit 801 at the bottom that is in a high resistance state, and thus it is read as "H" level. For the reason, a pattern of "EEEMMMMM" is obtained as an erasing mask. That is, in this example, the seventh bit is also to be erased.

Subsequently, in order to generate a programming mask, pre-reading is performed using a low resistance threshold value. In this example, the third bit is in the bit 802 at the bottom that is in a low resistance state, and thus it is read as "L" level. For the reason, a pattern of "MMMMPPMP" is obtained as a programming mask. That is, in this example, the third bit is also to be programmed.

[Operation of Information Processing System]

Figure 8:
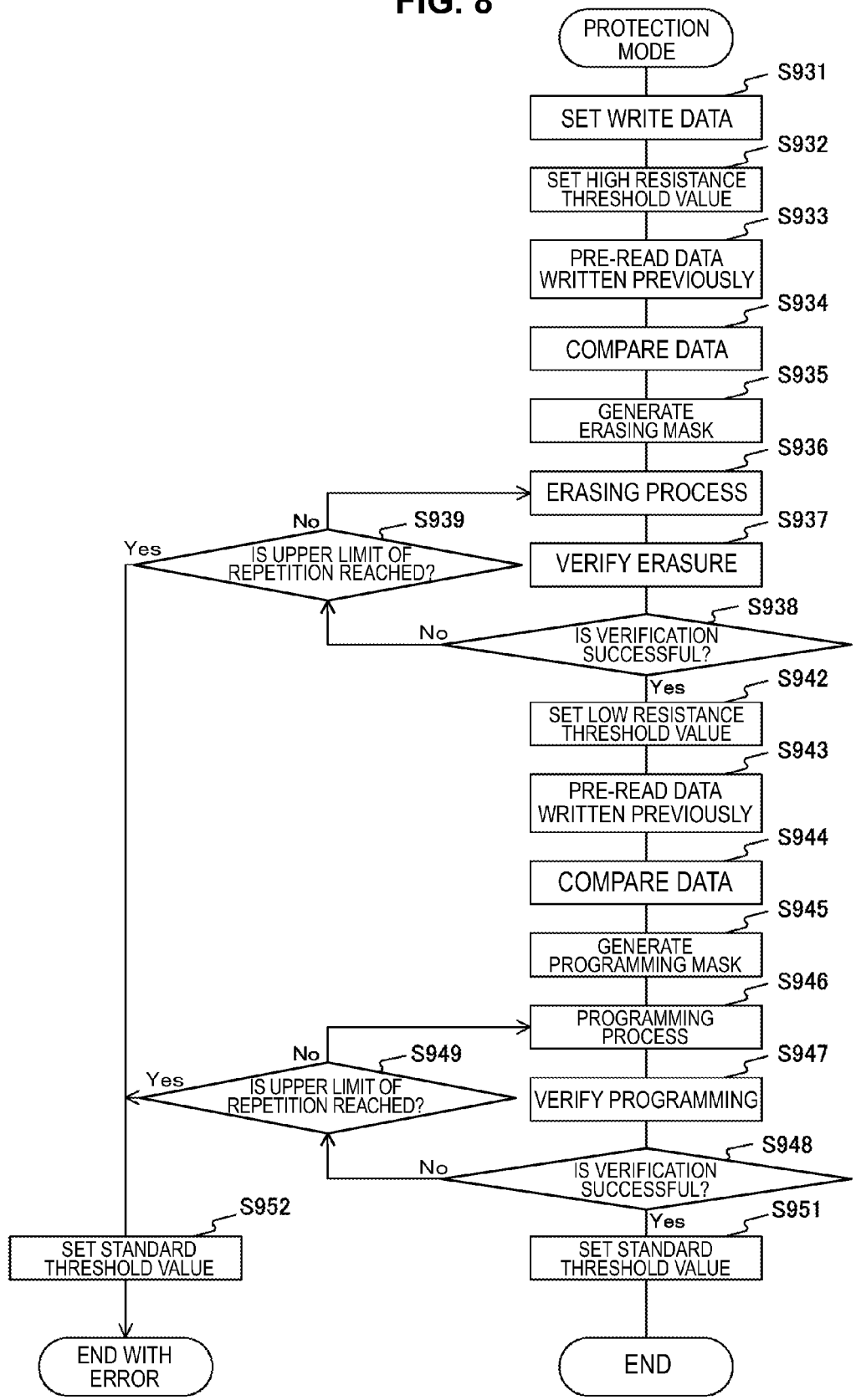
FIG. 8 is a flow diagram illustrating an exemplary procedure of a write process in a protection mode according to an embodiment of the present technology.

FIG. 8 is a flow diagram illustrating an exemplary procedure of a write process of an information processing system according to an embodiment of the present technology. First, when write data and a write instruction is issued to the NVRAM 301 (step S931), a high resistance threshold value is set to create an erasing mask (step S932), and pre-reading is performed from the memory cell 316 (step S933). This pre-reading is performed by the read processing unit 317. The write data is held in the write buffer 320, the pre-read data is held in the read buffer 330.

Then, the mask generation unit 341 compares the write data with the pre-read data (step S934) and generates an erasing mask in the manner described above (step S935). That is, there is generated an erasing mask which uses "E" as a pattern for a bit position where the write data is "L" level and the pre-read data is "H" level and which uses "M" as a pattern for the other bit positions. Then, in accordance with this erasing mask, an erasing process is performed on the memory cell 316 by the bitwise operation unit 315 (step S936). When this erasing process is performed, verification (Verify) is performed (step S937), this process is repeated until the verification is successful (step S938: No). However, if an upper limit number of repetition times is reached (step S939: Yes), then it is reset to the standard threshold value (step S952) and is ended with error.

Next, a low resistance threshold value is set to create a programming mask (step S942), and pre-reading is performed from the memory cell 316 (step S943). This pre-reading is performed by the read processing unit 317, and the pre-read data is held in the read buffer 330.

Then, the mask generation unit 341 compares the write data with the pre-read data (step S944) and generates a programming mask in the manner described above (step S945). That is, there is generated a programming mask which uses "P" as a pattern for a bit position where the write data is "H" level and the pre-read data is "L" level and which uses "M" as a pattern for the other bit positions. Then, in accordance with this programming mask, a programming process is performed on the memory cell 316 by the bitwise operation unit 315 (step S946). When this programming process is performed, verification (Verify) is performed (step S947), this process is repeated until the verification is successful (step S948: No). However, if an upper limit number of repetition times is reached (step S949: Yes), then it is reset to the standard threshold value (step S952) and is ended with error.

When the erasure and programming are completed, it is reset to the standard threshold value (step S951), and is normally ended. Noted that, although an example in which programming is performed after erasure is described above, the processing order may be reversed, and erasure may be performed after programming.

In this way, in accordance with the first embodiment of the present technology, a threshold value of pre-reading can be changed, and thus it is possible to read a bit at the bottom by setting it as a different state and perform writing again by modifying it, thereby improving the data retention characteristics.

2. Second Embodiment

In the first embodiment described above, rewriting of a bit at the bottom is always performed forcibly by causing the high resistance threshold value to be set when the erasing mask is created and by causing the low resistance threshold value to be set when the programming mask is created. In this case, the pre-reading is performed twice for each writing, and thus there is a problem that the operation is delayed. Thus, the operation mode in the first embodiment is referred to as a protection mode, and the description will be given of an example in which an operation is performed in the protection mode only as needed by regarding it as a second embodiment. A primary system configuration is similar to that described in the first embodiment, and thus, for example, the control unit 350 performs setting of the operation mode. That is, the control unit 350 is an example of an operation mode setting unit described in the claims.

[Operation of Information Processing System]

Figure 9:
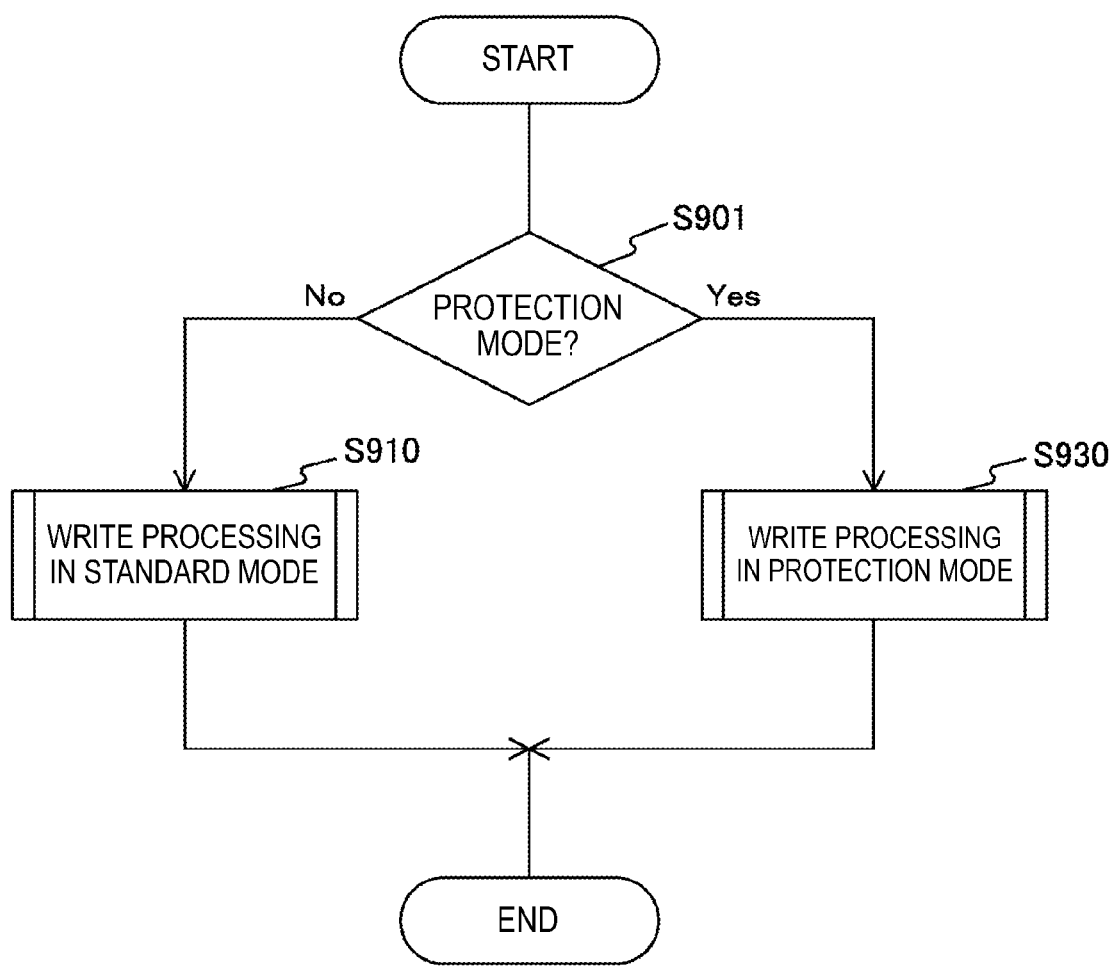
FIG. 9 is a flow diagram illustrating an exemplary processing procedure of an information processing system according to a second embodiment of the present technology.

FIG. 9 is a flow diagram illustrating an exemplary processing procedure of an information processing system according to the second embodiment of the present technology. In this second embodiment, it is assumed that an operation mode is determined by the control unit 350 of the NVRAM 301 according to an instruction from the host computer 100. In the standard mode, the pre-reading using the standard threshold value is performed once prior to writing. On the other hand, in the protection mode, similarly as the first embodiment, the pre-reading using the high resistance threshold value and the pre-reading using the low resistance threshold value are performed twice in total prior to writing.

If an instruction from the host computer 100 indicates a protection mode when a write process is performed (step S901: Yes), then the write process in the protection mode is performed (step S930). On the other hand, if the instruction from the host computer 100 indicates a standard mode (step S901: No), then the write process in the standard mode is performed (step S910). The write process in the standard mode (step S930) is similar in processing procedure to that described in FIG. 8.

Figure 10:
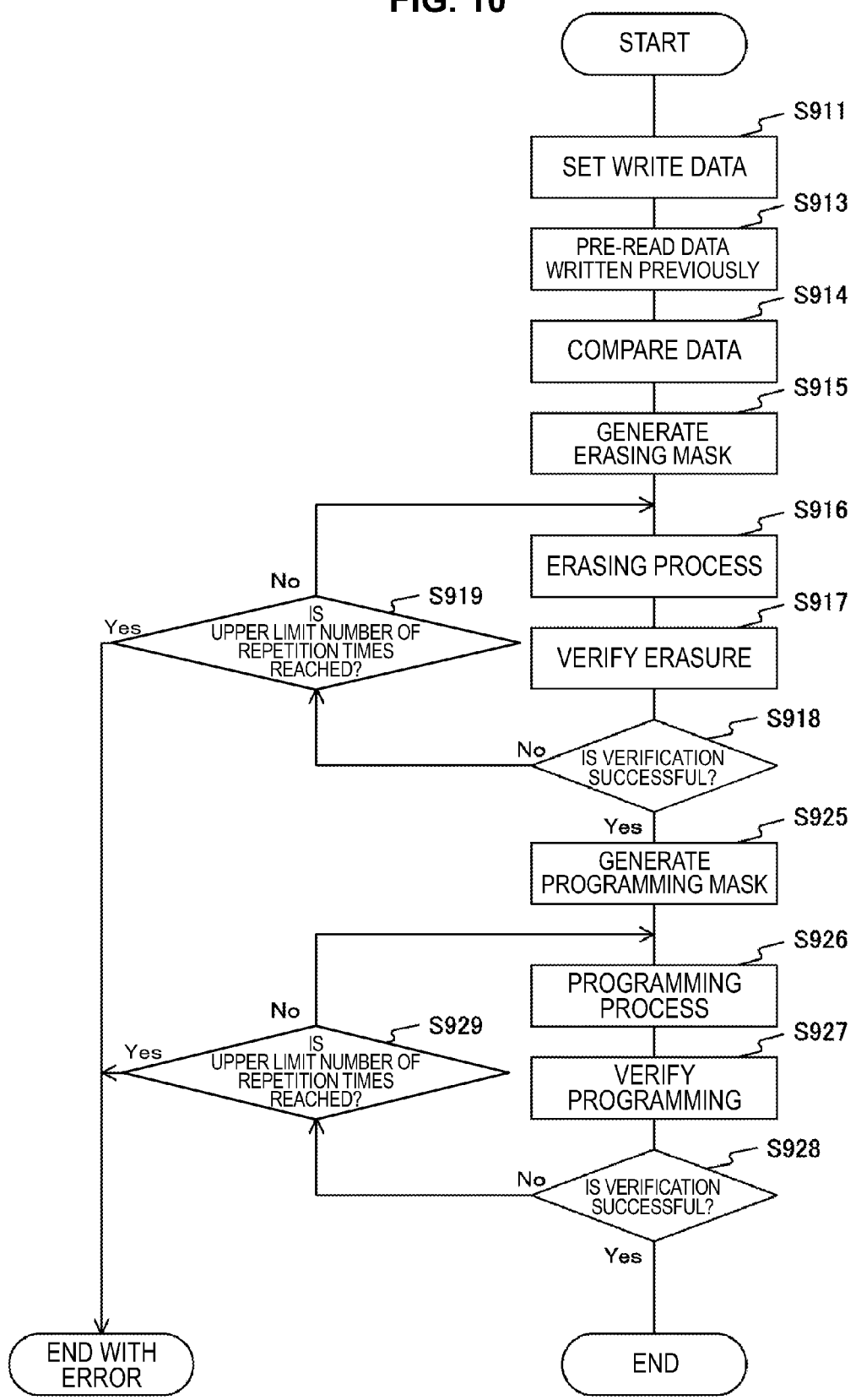
FIG. 10 is a flow diagram illustrating an exemplary procedure of a write process in a standard mode according to an embodiment of the present technology.

FIG. 10 is a flow diagram illustrating an exemplary procedure of a write process in a standard mode (step S910) according to the second embodiment of the present technology. First, when write data and a write instruction is issued to the NVRAM 301 (step S911), the pre-reading using a standard threshold value from the memory cell 316 is performed to create an erasing mask and a programming mask (step S913).

The pre-reading is performed by the read processing unit 317. The write data is held in the write buffer 320, the pre-read data is held in the read buffer 330.

Then, the mask generation unit 341 compares the write data with the pre-read data (step S914) and generates an erasing mask in the manner described above (step S915). That is, there is generated an erasing mask which uses "E" as a pattern for a bit position where the write data is "L" level and the pre-read data is "H" level and which uses "M" as a pattern for the other bit positions. Then, in accordance with this erasing mask, an erasing process is performed on the memory cell 316 by the bitwise operation unit 315 (step S916). When this erasing process is performed, verification (Verify) is performed (step S917), and this process is repeated until the verification is successful (step S918: No). However, if an upper limit number of repetition times is reached (step S919: Yes), then it is ended with error.

Next, the mask generation unit 341 generates a programming mask in the manner described above (step S925). That is, there is generated a programming mask which uses "P" as a pattern for a bit position where the write data is "H" level and the pre-read data is "L" level and which uses "M" as a pattern for the other bit positions. Then, in accordance with this programming mask, a program process is performed on the memory cell 316 by the bitwise operation unit 315 (step S926). When this program process is performed, verification (Verify) is performed (step S927), and this process is repeated until the verification is successful (step S928: No). However, if an upper limit number of repetition times is reached (step S929: Yes), then it is ended with error.

When the erasure and programming are completed, the write process is ended normally. Noted that, although an example in which programming is performed after erasure is described above, the processing order may be reversed, and erasure may be performed after programming.

In this way, in accordance with the second embodiment of the present technology, the number of pre-reading times can be suppressed by changing an operation mode so that a bit at the bottom is not forcibly modified again depending on the situation.

3. Third Embodiment

In ReRAM that uses a variable resistance element, data retention characteristics are deteriorated as time passed since data is held, as a result, the number of errors to be detected and corrected by error correcting code (ECC) increases. For example, when an error correcting code having bit correction capability capable of processing up to four bits is used, an error of up to four bits can be corrected, but an error of more than four bits cannot be corrected. For this reason, it is effective to use an approach (data refresh) of rewriting the error-corrected data before correction becomes impossible. However, when the control as in the standard mode of the second embodiment described above is performed, if the pre-read data and the write data are the same, then programs in all bits are also not erased. On the other hand, when the control as in the protection mode is always performed, the number of pre-reading times increases and thus there is a risk that the operation is delayed.

Thus, in a third embodiment described later, a read operation is performed using the standard threshold value, and if an error is detected and the detected error can be corrected, data refresh in the protection mode is performed. As a result, the improvement is achieved from the viewpoint of operation speed, compared to the case of using always the protection mode, and in addition, when the data refresh using the protection mode is performed, data retention characteristics are improved by performing the modification and writing on a bit at the bottom. These series of operations for the data refresh are performed only within the memory system 400, and thus the host computer 100 higher than the memory system 400 may not have to be conscious of that. In addition, the primary system configuration is similar to that described in the first embodiment.

[Operation of Information Processing System]

Figure 11:
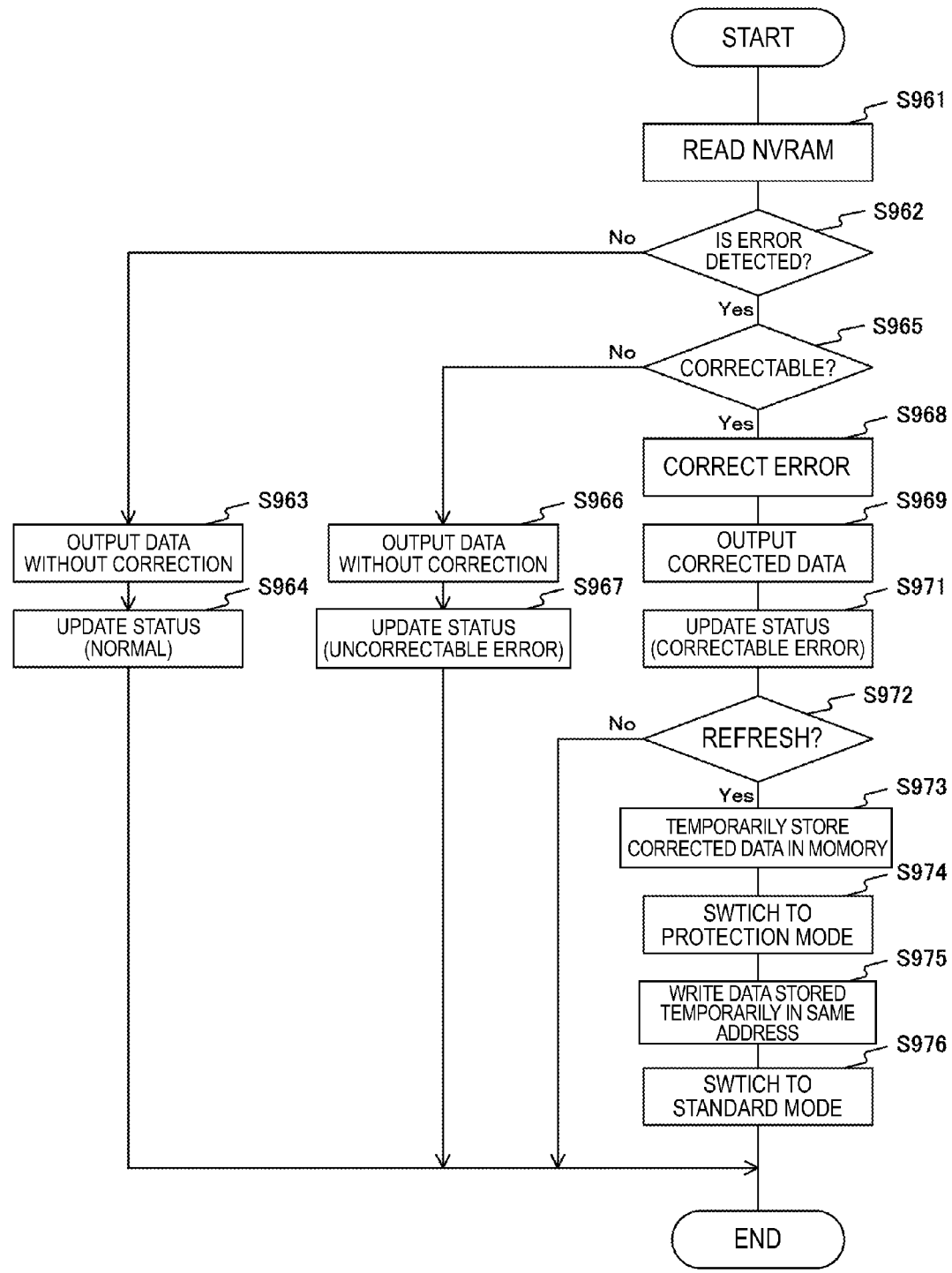
FIG. 11 is a flow diagram illustrating an exemplary processing procedure of an information processing system according to a third embodiment of the present technology.

FIG. 11 is a flow diagram illustrating an exemplary processing procedure of an information processing system according to a third embodiment of the present technology. In this third embodiment, when a read command is received from the host computer 100, the read processing unit 317 reads data using the standard threshold value from a specified read address of the NVRAM 301 (step S961). If the read address is a logical address, it is converted into a physical address within the memory system 400, and data is read from a corresponding physical address of the NVRAM 301. In this case, an address conversion table used to convert a logical address into a physical address may be provided.

Next, the ECC processing unit 230 checks whether the read data contains an error. If an error is not detected (step S962: No), then the read data is outputted to the host computer 100 (step S963), and the status is updated to "normal" (step S964). This status is stored in, for example, a register, and the host computer 100 can check whether processing is normally ended by reading it from the register.

If an error is detected (step S962: Yes), then it is determined whether this error is correctable. If it is determined that the error is uncorrectable (step S965: No), then the read data is outputted to the host computer 100 without correction (step S966), and the status is updated to "uncorrectable error" (step S967). Note that, in this case, processing is ended with error, and thus a case where the read data is not outputted to the host computer 100 can be considered.

If an error is correctable (step S965: Yes), then error correction is performed by the ECC processing unit 230 (step S968). Then, the corrected data is outputted to the host computer 100 (step S969), and the status is updated to "correctable error" (step S971).

After the error correction is completed (step S971), it is determined whether the data refresh is performed. For example, there is provided a reference in which the number of bits is set as a threshold value, such as in a case in which, when the correction capability of the ECC processing unit 230 is four bits, if a correctable error of three bits or more occurs, then the data refresh is performed. If it is determined that the data refresh is necessary (step S972: Yes), the corrected data is stored temporarily in any area of, for example, the memory 300 in preparation to rewriting (step S973).

Then, the operation mode is switched from the standard mode to the protection mode (step S974). It is considered that one cause of occurrence of an ECC error is the deterioration of data retention characteristics with the passage of time, and there is a risk that the bit at the bottom other than bits in which ECC error has occurred is frequently occurring, thus it is necessary to perform the modification and writing by switching to the protection mode.

Then, in the switched protection mode, the corrected data stored temporarily in the memory is rewritten to the relevant address (step S975). Thereby, the modification and writing are performed on the bit in which an ECC error has occurred and the other bits at the bottom. The non-volatile memory using a variable resistance element is different from, for example, NAND flash memory using a floating gate, and can perform a rewriting operation to the same address. Thus, even when an address conversion table used to convert from a logical address into a physical address is provided, it is not necessary to perform the updating.

Then, the operation mode is switched to the standard mode (step S976), and the read operation is ended.

In this way, according to the third embodiment of the present technology, it is possible to implement the data refresh by rewriting the corrected data in the protection mode when a correctable error is detected during the read access.

4. Fourth Embodiment

In the information processing system, data may be sometimes classified into any one of "hot" and "cold" by the application at the higher-level host computer 100 side. The "hot" data indicates data in which rewriting is performed more frequently, and the "cold" data indicates data in which rewriting is performed less frequently. For example, data such as the kernel of operating systems can be classified into the "cold" data because the data is rewritten less frequently after it is written once. The classification of the "hot" or "cold" data is largely dependent on the application, and thus it is desirable to perform notification or controlling of "hot" or "cold" from the higher-level host computer 100 to the memory system 400. In the fourth embodiment, it is assumed that attribute of data is specified by classifying into three categories of "hot", "cold", and "normal" other than hot and cold by using a command from the host computer 100.

FIG. 12 is a flow diagram illustrating an exemplary processing procedure of an information processing system according to the fourth embodiment of the present technology. When the memory system 400 receives a write command from the host computer 100 and the attribute of the specified data is specified as "cold" (step S902), writing is performed on the NVRAM 301 using the protection mode (step S930). The use of the protection mode makes it possible to prevent the occurrence of errors beforehand even for the bit having poor data retention characteristics, for example, by performing a process of modifying and writing and a process of modifying and erasing when "cold" data is written at the beginning.

Furthermore, the writing in the standard mode is performed for the writing of the data of normal attribute and the data of "hot" attribute other than "cold" attribute (step S910). This is because it is advantageous from a writing time point of view. On the other hand, the data of "cold" attribute has a less frequent number of writing originally, and thus the penalty of speed reduction caused by the use of protection mode does not matter.

Here, the processing procedure of step S910 is similar to that described with reference to FIG. 10, and the processing procedure of step S930 is similar to that described with reference to FIG. 8.

In this way, in accordance with the fourth embodiment of the present technology, it is possible to suppress appropriately the number of pre-reading times by dynamically changing the operation mode according to the attribute of data.

In addition, in the fourth embodiment, there has been described an example of selecting a method of writing to the NVRAM 301 by explicitly specifying the attribute of "hot" or "cold" from the host computer 100. However, depending on the storage interface to be used, such as USB, SATA or the like, there is also a specification in which the attribute of data is unable to be notified to the memory system 400. In a case of the memory system 400 as described above, it can be also considered that a memory access pattern is analyzed by the processor 210 in the memory system 400 and whether it is "hot" and "cold" is determined autonomously, thereby selecting an operation mode.

It should be noted the above-described embodiments are examples to realize the present technology, and items in the embodiments are in a corresponding relationship with invention specific items in the claims. At the same time, the invention specific items in the claims are in a corresponding relationship with items of the embodiments of the present technology to which the same names as those of the invention specific items are given. However, the present technology is not limited to the embodiments, and can be realized by variously modifying the embodiments within the scope of the technology.

In addition, the procedures of the processes described in the embodiments above may be understood as a method that includes a series of the processes, or as a program that instructs a computer to execute the series of the processes and a recording medium in which such a program is stored. As the recording medium, for example, CDs (Compact Discs), MDs (MiniDiscs), DVD (Digital Versatile Disks), memory cards, blu-ray discs (Blu-ray Discs (registered trademark)), and the like can be used.

Additionally, the present technology may also be configured as below.

(1)

A storage control device including:

a first read processing unit configured to read data having any one value of a first value or a second value based on a first threshold value in a memory cell, the data being read as first read data;

a first write processing unit configured to rewrite the memory cell to the first value when write data is the first value and the first read data is the second value;

a second read processing unit configured to read second read data based on a second threshold value different from the first threshold value in the memory cell; and a second write processing unit configured to rewrite the memory cell to the second value when the write data is the second value and the second read data is the first value.

(2)

The storage control device according to (1), wherein the memory cell is a variable resistance element, wherein the first threshold value is set to a higher resistance state side than a standard threshold value, and wherein the second threshold value is set to a lower resistance state side than the standard threshold value.

(3)

The storage control device according to (2)

wherein the first value is a logical value 0, and wherein the second value is a logical value 1.

(4)

The storage control device according to (1)

wherein the memory cell is a variable resistance element, wherein the first threshold value is set to a lower resistance state side than a standard threshold value, and wherein the second threshold value is set to a higher resistance state side than the standard threshold value.

(5)

The storage control device according to (4)

wherein the first value is a logical value 1, and wherein the second value is a logical value 0.

(6)

A storage control device including:

an operation mode setting unit configured to set any one of a first mode or a second mode as an operation mode;

a first read processing unit configured to read data having any one value of a first value or a second value based on a first threshold value in a memory cell in a case where the first mode is set, the data being read as first read data;

a first write processing unit configured to rewrite the memory cell to the first value when write data is the first value and the first read data is the second value in a case where the first mode is set;

a second read processing unit configured to read second read data based on a second threshold value different from the first threshold value in the memory cell in a case where the first mode is set;

a second write processing unit configured to rewrite the memory cell to the second value when the write data is the second value and the second read data is the first value in a case where the first mode is set;

a third read processing unit configured to read a third read data based on a standard threshold value in the memory cell in a case where the second mode is set; and a third write processing unit configured to rewrite the memory cell to the first value when the write data is the first value and the third read data is the second value and configured to rewrite the memory cell to the second value when the write data is the second value and the third read data is the first value, in a case where the second mode is set.

(7)

The storage control device according to (6), wherein, if an error is detected and an error correction is performed on the detected error upon read processing, the first mode is set as the operation mode, an address for the error correction is set as the write address, and the error-corrected data is rewritten as the write data.

(8)

A storage device including:

a memory array configured to include a memory cell;

a first read processing unit configured to read data having any one value of a first value or a second value based on a first threshold value in the memory cell, the data being read as first read data;

a first write processing unit configured to rewrite the memory cell to the first value when write data is the first value and the first read data is the second value;

a second read processing unit configured to read second read data based on a second threshold value different from the first threshold value in the memory cell; and a second write processing unit configured to rewrite the memory cell to the second value when the write data is the second value and the second read data is the first value.

(9)

A storage device including:

a memory array configured to include a memory cell;

an operation mode setting unit configured to set any one of a first mode or a second mode as an operation mode;

a first read processing unit configured to read data having any one value of a first value or a second value based on a first threshold value in the memory cell in a case where the first mode is set, the data being read as first read data;

a first write processing unit configured to rewrite the memory cell to the first value when write data is the first value and the first read data is the second value in a case where the first mode is set;

a second read processing unit configured to read second read data based on a second threshold value different from the first threshold value in the memory cell in a case where the first mode is set;

a second write processing unit configured to rewrite the memory cell to the second value when the write data is the second value and the second read data is the first value in a case where the first mode is set;

a third read processing unit configured to read a third read data based on a standard threshold value in the memory cell in a case where the second mode is set; and a third write processing unit configured to rewrite the memory cell to the first value when the write data is the first value and the third read data is the second value and configured to rewrite the memory cell to the second value when the write data is the second value and the third read data is the first value, in a case where the second mode is set.

(10)

An information processing system including:

a memory array configured to include a memory cell;

an operation mode setting unit configured to set any one of a first mode or a second mode as an operation mode;

a first read processing unit configured to read data having any one value of a first value or a second value based on a first threshold value in the memory cell in a case where the first mode is set, the data being read as first read data;

a first write processing unit configured to rewrite the memory cell to the first value when write data is the first value and the first read data is the second value in a case where the first mode is set;

a second read processing unit configured to read second read data based on a second threshold value different from the first threshold value in the memory cell in a case where the first mode is set;

a second write processing unit configured to rewrite the memory cell to the second value when the write data is the second value and the second read data is the first value in a case where the first mode is set;

a third read processing unit configured to read a third read data based on a standard threshold value in the memory cell in a case where the second mode is set;

a third write processing unit configured to rewrite the memory cell to the first value when the write data is the first value and the third read data is the second value and configured to rewrite the memory cell to the second value when the write data is the second value and the third read data is the first value, in a case where the second mode is set; and a host computer configured to issue a read command or a write command to the memory array.

(11)

The storage control device according to (10), wherein the host computer adds information about a rewriting frequency of write data according to the write command to the write command and issues the command, and wherein the operation mode setting unit sets the first mode if the rewriting frequency of the write data indicates a low frequency, and sets the second mode if otherwise.

(12)

A storage controlling method including:

performing a first read process of reading data having any one value of a first value or a second value based on a first threshold value in a memory cell, the data being read as first read data;

performing a first write process of rewriting the memory cell to the first value when write data is the first value and the first read data is the second value;

performing a second read process of reading second read data based on a second threshold value different from the first threshold value in the memory cell; and performing a second write process of rewriting the memory cell to the second value when the write data is the second value and the second read data is the first value.

REFERENCE SIGNS LIST 100 host computer
200 memory controller
201 host interface
210 processor
220 internal memory
230 ECC processing unit
250 peripheral circuit
280 bus
291-293 memory interface
300 memory
301 non-volatile random access memory (NVRAM)
302 flash memory
303 volatile memory
309 control interface
310 memory array
311 data part
312 redundant part
313 sense amplifier
315 bitwise operation unit
316 memory cell
317 read processing unit
320 write buffer
330 read buffer
340 logic determination unit
341 mask generation unit
350 control unit
360 threshold value setting unit
400 memory system

The invention claimed is:

1. A storage control device comprising:
a first read processing unit configured to read data having any one value of a first value or a second value based on a first threshold value in a memory cell, the data being read as first read data;
a first write processing unit configured to rewrite the memory cell to the first value when write data is the first value and the first read data is the second value;
a second read processing unit configured to read second read data based on a second threshold value different from the first threshold value in the memory cell; and
a second write processing unit configured to rewrite the memory cell to the second value when the write data is the second value and the second read data is the first value.

2. The storage control device according to claim 1,
wherein the memory cell is a variable resistance element,
wherein the first threshold value is set to a higher resistance state side than a standard threshold value, and
wherein the second threshold value is set to a lower resistance state side than the standard threshold value.

3. The storage control device according to claim 2
wherein the first value is a logical value 0, and
wherein the second value is a logical value 1.

4. The storage control device according to claim 1
wherein the memory cell is a variable resistance element,
wherein the first threshold value is set to a lower resistance state side than a standard threshold value, and
wherein the second threshold value is set to a higher resistance state side than the standard threshold value.

5. The storage control device according to claim 4
wherein the first value is a logical value 1, and
wherein the second value is a logical value 0.

6. A storage control device comprising:
an operation mode setting unit configured to set any one of a first mode or a second mode as an operation mode;
a first read processing unit configured to read data having any one value of a first value or a second value based on a first threshold value in a memory cell in a case where the first mode is set, the data being read as first read data;
a first write processing unit configured to rewrite the memory cell to the first value when write data is the first value and the first read data is the second value in a case where the first mode is set;
a second read processing unit configured to read second read data based on a second threshold value different from the first threshold value in the memory cell in a case where the first mode is set;
a second write processing unit configured to rewrite the memory cell to the second value when the write data is the second value and the second read data is the first value in a case where the first mode is set;
a third read processing unit configured to read a third read data based on a standard threshold value in the memory cell in a case where the second mode is set; and
a third write processing unit configured to rewrite the memory cell to the first value when the write data is the first value and the third read data is the second value and configured to rewrite the memory cell to the second value when the write data is the second value and the third read data is the first value, in a case where the second mode is set.

7. The storage control device according to claim 6, wherein, if an error is detected and an error correction is performed on the detected error upon read processing, the first mode is set as the operation mode, an address for the error correction is set as the write address, and the error-corrected data is rewritten as the write data.

8. A storage device comprising:
a memory array configured to include a memory cell;
a first read processing unit configured to read data having any one value of a first value or a second value based on a first threshold value in the memory cell, the data being read as first read data;
a first write processing unit configured to rewrite the memory cell to the first value when write data is the first value and the first read data is the second value;
a second read processing unit configured to read second read data based on a second threshold value different from the first threshold value in the memory cell; and
a second write processing unit configured to rewrite the memory cell to the second value when the write data is the second value and the second read data is the first value.

9. A storage device comprising:
a memory array configured to include a memory cell;
an operation mode setting unit configured to set any one of a first mode or a second mode as an operation mode;
a first read processing unit configured to read data having any one value of a first value or a second value based on a first threshold value in the memory cell in a case where the first mode is set, the data being read as first read data;
a first write processing unit configured to rewrite the memory cell to the first value when write data is the first value and the first read data is the second value in a case where the first mode is set;
a second read processing unit configured to read second read data based on a second threshold value different from the first threshold value in the memory cell in a case where the first mode is set;
a second write processing unit configured to rewrite the memory cell to the second value when the write data is the second value and the second read data is the first value in a case where the first mode is set;

a third read processing unit configured to read a third read data based on a standard threshold value in the memory cell in a case where the second mode is set; and a third write processing unit configured to rewrite the memory cell to the first value when the write data is the first value and the third read data is the second value and configured to rewrite the memory cell to the second value when the write data is the second value and the third read data is the first value, in a case where the second mode is set.

10. An information processing system comprising:

a memory array configured to include a memory cell;

an operation mode setting unit configured to set any one of a first mode or a second mode as an operation mode;

a first read processing unit configured to read data having any one value of a first value or a second value based on a first threshold value in the memory cell in a case where the first mode is set, the data being read as first read data;

a first write processing unit configured to rewrite the memory cell to the first value when write data is the first value and the first read data is the second value in a case where the first mode is set;

a second read processing unit configured to read second read data based on a second threshold value different from the first threshold value in the memory cell in a case where the first mode is set;

a second write processing unit configured to rewrite the memory cell to the second value when the write data is the second value and the second read data is the first value in a case where the first mode is set;

a third read processing unit configured to read a third read data based on a standard threshold value in the memory cell in a case where the second mode is set;

a third write processing unit configured to rewrite the memory cell to the first value when the write data is the first value and the third read data is the second value and configured to rewrite the memory cell to the second value when the write data is the second value and the third read data is the first value, in a case where the second mode is set; and a host computer configured to issue a read command or a write command to the memory array.

11. The information processing system according to claim 10, wherein the host computer adds information about a rewriting frequency of write data according to the write command to the write command and issues the command, and wherein the operation mode setting unit sets the first mode if the rewriting frequency of the write data indicates a low frequency, and sets the second mode if otherwise.

12. A storage controlling method comprising:

performing a first read process of reading data having any one value of a first value or a second value based on a first threshold value in a memory cell, the data being read as first read data;

performing a first write process of rewriting the memory cell to the first value when write data is the first value and the first read data is the second value;

performing a second read process of reading second read data based on a second threshold value different from the first threshold value in the memory cell; and performing a second write process of rewriting the memory cell to the second value when the write data is the second value and the second read data is the first value.

* * * * *